United States Patent
Watanabe

(10) Patent No.: US 9,239,362 B2
(45) Date of Patent: Jan. 19, 2016

(54) BATTERY-TYPE DETERMINATION APPARATUS, BATTERY-TYPE DETERMINATION METHOD, AND ELECTRONIC APPARATUS

(71) Applicant: CASIO COMPUTER CO., LTD., Shibuya-ku, Tokyo (JP)

(72) Inventor: Kouichirou Watanabe, Akishima (JP)

(73) Assignee: CASIO COMPUTER CO., LTD., Tokyo (JP)

(*) Notice: Subject to any disclaimer, the term of this patent is extended or adjusted under 35 U.S.C. 154(b) by 410 days.

(21) Appl. No.: 13/914,465

(22) Filed: Jun. 10, 2013

(65) Prior Publication Data

US 2013/0328567 A1 Dec. 12, 2013

(30) Foreign Application Priority Data

Jun. 11, 2012 (JP) ................... 2012-132390

(51) Int. Cl.
*G01N 27/416* (2006.01)
*G01R 31/36* (2006.01)
*H01M 6/50* (2006.01)
*H01M 10/42* (2006.01)
*H01M 10/48* (2006.01)

(52) U.S. Cl.
CPC .......... *G01R 31/3606* (2013.01); *H01M 6/5066* (2013.01); *H01M 10/4221* (2013.01); *H01M 10/48* (2013.01); *G01R 31/3665* (2013.01)

(58) Field of Classification Search
CPC .......... G01R 31/3606; G01R 31/3665; H01M 6/5066
USPC .................. 324/426, 433, 435, 437
See application file for complete search history.

(56) References Cited

U.S. PATENT DOCUMENTS

| 5,451,881 A * | 9/1995 | Finger ................ G01R 31/3624 320/136 |
| 7,996,165 B2 * | 8/2011 | Keuss ................ G01R 31/3631 320/149 |

(Continued)

FOREIGN PATENT DOCUMENTS

| CN | 1144423 A | 3/1997 |
| CN | 101354431 A | 1/2009 |
| CN | 102193068 A | 9/2011 |
| JP | 08304518 A | 11/1996 |

(Continued)

OTHER PUBLICATIONS

Chinese Office Action (and English translation thereof) dated Jun. 1, 2015, issued in counterpart Chinese Application No. 2013102308084.

*Primary Examiner* — Richard Isla Rodas
*Assistant Examiner* — Nathaniel Pelton
(74) *Attorney, Agent, or Firm* — Holtz, Holtz, Goodman & Chick PC

(57) ABSTRACT

A battery-type determination apparatus includes a battery installation unit equipped with battery connection terminals in which a battery is installed, a voltage detector that detects a voltage generated by Seebeck effect between a battery connection terminal and an electrode of the battery, a temperature rise controller that raises a temperature at a contact point between the electrode of the battery and the battery connection terminal, and a type determination unit that determines a type of the battery installed in the battery installation unit, based on the voltage detected by the voltage detector with the temperature risen at the contact point.

12 Claims, 4 Drawing Sheets

(56) References Cited

U.S. PATENT DOCUMENTS

2011/0231122 A1 9/2011 Fábregas et al.
2013/0323542 A1* 12/2013 Wijayawardhana .... H01M 4/00
　　　　　　　　　　　　　　　　　　　　429/50

FOREIGN PATENT DOCUMENTS

| JP | 11-250942 A | 9/1999 |
| JP | 11339863 A | 12/1999 |
| JP | 2008-003022 A | 1/2008 |

* cited by examiner

FIG.1
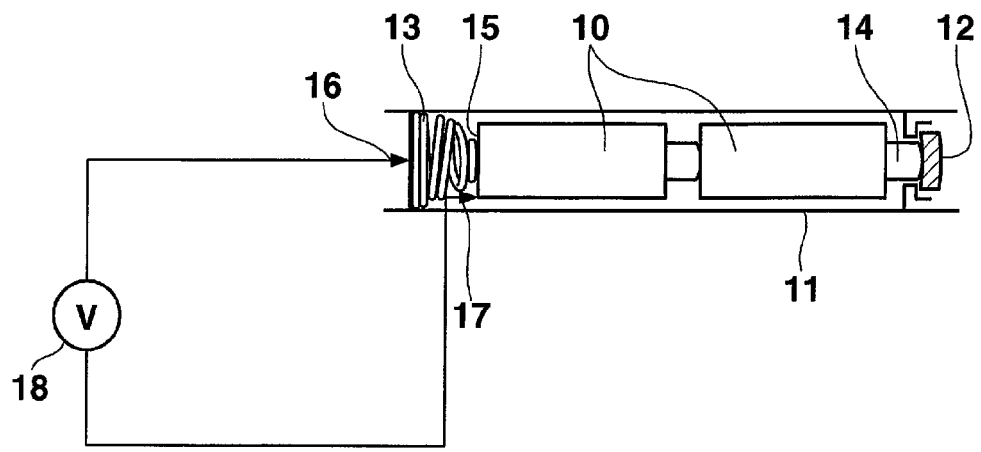
FIG.2A
FIG.2B
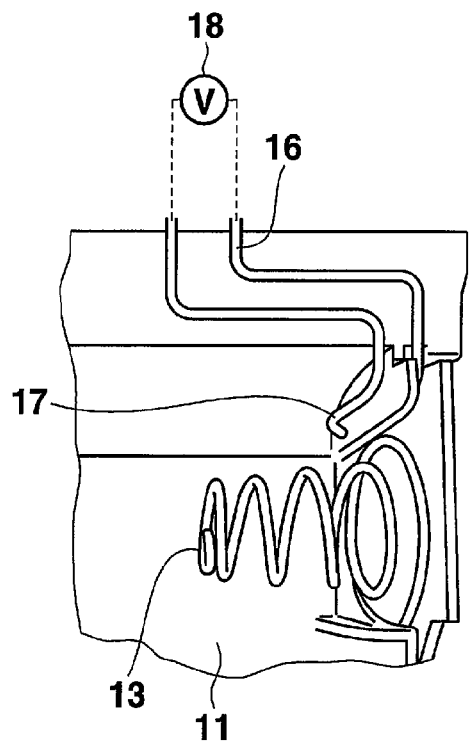
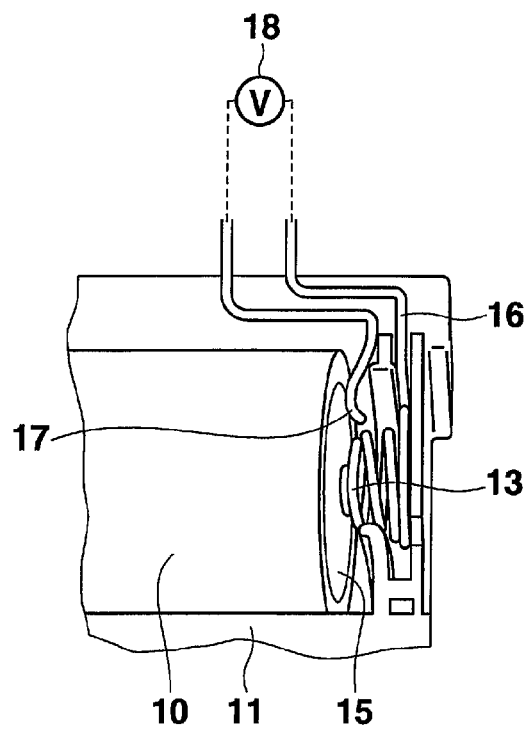

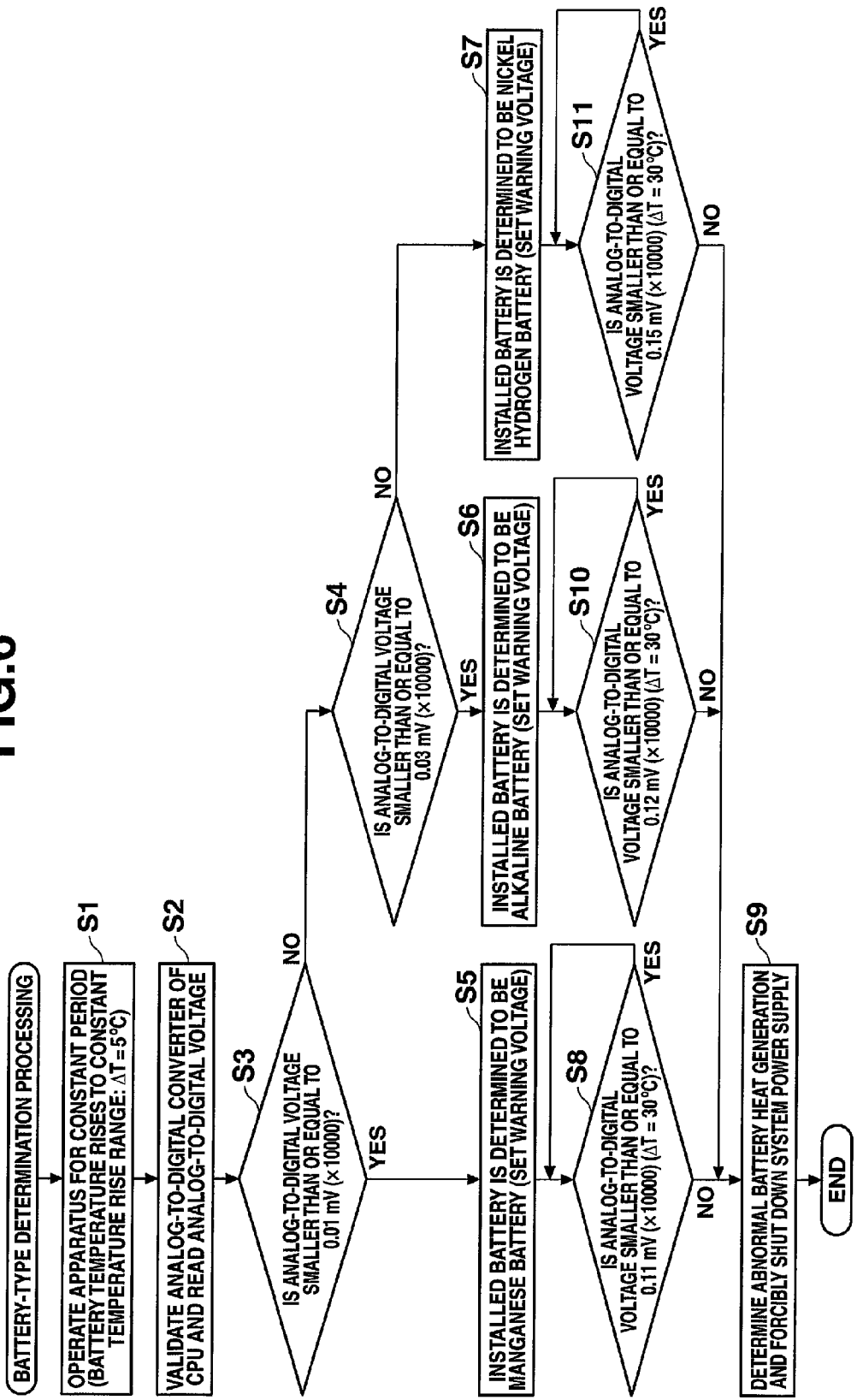

BATTERY-TYPE DETERMINATION APPARATUS, BATTERY-TYPE DETERMINATION METHOD, AND ELECTRONIC APPARATUS

CROSS-REFERENCE TO RELATED APPLICATIONS

This application is based upon and claims the benefit of priority from prior Japanese Patent Application No. 2012-132390, filed Jun. 11, 2012, the entire contents of which are incorporated herein by reference.

BACKGROUND OF THE INVENTION

1. Field of the Invention

The invention relates to a battery-type determination apparatus, a battery-type determination method, and an electronic apparatus for determining a type of a battery.

2. Description of the Related Art

Batteries are conventionally used as driving power supplies for a variety of electronic apparatuses. Batteries are classified into a plurality of types, e.g., dry cells of manganese batteries and alkaline batteries, and rechargeable nickel hydride batteries. These types of batteries have respectively different battery lifetimes and discharging properties. For example, the battery lifetimes are longest in the order from manganese batteries, alkaline batteries, and nickel hydride batteries. With respect to a drop property from the start of a voltage drop, both of the manganese and alkaline batteries show gentle voltage drops, while the nickel hydride batteries show a comparatively steep drop.

Therefore, for example, an electronic dictionary, a calculator, a touchpanel-type personal digital assistant (PDA), which are electronic apparatuses each operated by a CPU driven with a rated voltage, need to set different voltage values (or thresholds) for warning consumption of battery due to reduction in remaining battery power, depending on types of batteries, for example, by setting a higher voltage value for use of hydrogen batteries than use of alkaline batteries.

Conventionally, an electronic apparatus which allows use of a plurality of types of batteries has a function to allow a user to select/set and store a battery type. Depending on battery types stored, setting voltage values are switched to issue warnings as mentioned above concerning consumption of battery.

In a conventional remaining-battery determination apparatus, voltage drop amounts of battery voltages without load and under maximum load are compared with thresholds for determining battery types, to thereby determine a battery type. Further consideration is taken into determination on whether battery power remains or not by comparison with a threshold for determining remaining battery power (for example, Jpn. Pat. Appln. KOKAI Publication No. 2008-003022).

An apparatus has been designed which detects a battery type by determining a battery type, based on a difference between a current value flowing during driving of an electronic apparatus and a current value flowing during not driving of the electronic apparatus (for example, refer to Jpn. Pat. Appln. KOKAI Publication No. 11-250942).

Among electronic apparatuses which allow use of a plurality of types of batteries, there is an electronic apparatus which allows a user to select and set a battery type. The electronic apparatus not only requires the user to set a battery type repeatedly each time a battery is replaced with a different type of battery, but also possibly causes a problem in warning consumption of battery due to a setting error.

In a method of determining a battery type by a conventional remaining-battery-power determination apparatus or a battery-type detection apparatus, an amount of voltage drop and a difference in current values are greatly influenced by an amount of remaining battery. Therefore, particularly when an amount of remaining battery is small, there is a problem that a determination error easily occurs.

Under the circumstances, it is desired to provide a battery-type determination apparatus, a battery-type determination method, and an electronic apparatus including the battery-type determination apparatus, which are capable of distinguishing battery types.

BRIEF SUMMARY OF THE INVENTION

According to an aspect of the invention, there is provided a battery-type determination apparatus comprising: a battery installation unit equipped with battery connection terminals in which a battery is installed; a voltage detector that detects a voltage generated by Seebeck effect between a battery connection terminal and an electrode of the battery; a temperature rise controller that raises a temperature at a contact point between the electrode of the battery and the battery connection terminal; and a type determination unit that determines a type of the battery installed in the battery installation unit, based on the voltage detected by the voltage detector with the temperature risen at the contact point.

According to another aspect of the invention, there is provided an electronic apparatus comprising: a battery installation unit equipped with battery connection terminals in which a battery is installed; a voltage detector that detects a voltage generated by Seebeck effect between a battery connection terminal and an electrode of the battery; a temperature rise controller that raises a temperature at a contact point between the electrode of the battery and the battery connection terminal; and a type determination unit that determines a type of the battery installed in the battery installation unit, based on the voltage detected by the voltage detector with the temperature risen at the contact point; and a voltage setting unit that sets a voltage value for monitoring a state of the battery, depending on the type of the battery determined by the type determination unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 shows a configuration of a battery-type determination circuit in a battery-type determination apparatus according to an embodiment of the invention;

FIGS. 2A and 2B each show a specific circuit structure of a battery-spring-voltage detection terminal 16 and a battery-anode-voltage detection terminal 17 in a battery box 11 of the battery-type determination circuit;

FIG. 6 is a flowchart showing a battery-type determination processing in an electronic apparatus including the battery-type determination circuit.

DETAILED DESCRIPTION OF THE INVENTION

Figure 3:
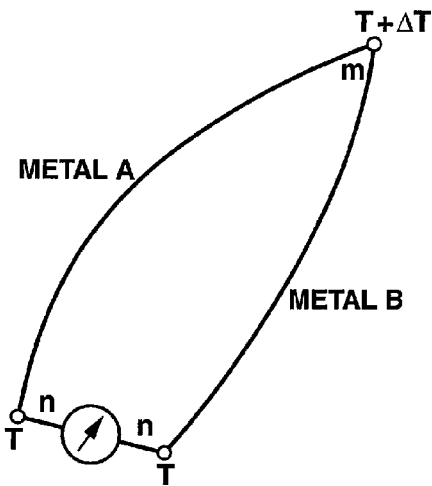
FIG. 3 shows for explaining an electromotive voltage of Seebeck effect.

Hereinafter, embodiments of the invention will be described with reference to the drawings.

FIG. 1 shows a configuration of a battery-type determination circuit in a battery-type determination apparatus according to an embodiment of the invention.

The battery-type determination circuit is provided in an electronic apparatus which is driven by a battery as a power supply.

Described now will be an electronic apparatus which is driven by two size-AA batteries as a power supply.

A cathode battery spring 12 and anode battery spring (metal A: steel wire for spring) 13 are provided as battery connection terminals in a battery box 11 of the electronic apparatus. Two size-AA batteries 10 connected in series are installed between the springs with a battery cathode 14 and a battery anode (metal B) 15 sandwiched therebetween.

One end of the anode battery spring (metal A) 13 of the battery box 11 is brought into contact with a center part of the battery anode 15, and the other end on the opposite side of the box 11 is provided with a battery-spring-voltage detection terminal 16. A battery-anode-voltage detection terminal 17 is provided at a position in contact with an outer circumferential part distant from a center part of the battery anode 15.

The battery-spring-voltage detection terminal 16 and the battery-anode-voltage detection terminal 17 are connected to a Seebeck voltage detector 18. The Seebeck voltage detector 18 detects an electromotive voltage generated by the Seebeck effect when a temperature difference ΔT to an ambient temperature T occurs at a contact part between the anode battery spring (metal A) 13 and the battery anode (metal B) 15.

FIG. 2A and FIG. 2B each show a specific circuit structure of a battery-spring-voltage detection terminal 16 and a battery-anode-voltage detection terminal 17 in the battery box 11 of the battery-type determination circuit.

As shown in FIG. 2A and FIG. 2B, the battery-spring-voltage detection terminal 16 is connected to an end of the anode battery spring 13 opposite to the other end thereof in contact with the battery anode 15, as described above, and is led and connected to the Seebeck voltage detector 18 in the apparatus.

The battery-anode-voltage detection terminal 17 is provided at a position in contact with an outer circumferential part distant from the center of the anode 15 of one of the batteries 10 installed in the battery box 11 and is led and connected to the Seebeck voltage detector 18 in the apparatus.

FIG. 3 shows for explaining an electromotive voltage of the Seebeck effect.

Two ends of two types of metals A (anode battery spring 13) and B (battery anode 15) are connected to each other, to form a closed circuit. To the ambient temperature T, the temperature-difference LT is caused to occur at a contact point m. Then, an electromotive voltage (electromotive force) of the Seebeck effect is generated at the other contact point which is maintained at the ambient temperature T.

The electromotive voltage (Seebeck voltage) V of the Seebeck effect is obtained by multiplying the temperature-difference ΔT by a Seebeck coefficient α. The Seebeck coefficient α is determined depending on a combination of the foregoing two types of metals A (anode battery spring 13) and B (battery anode 15).

In general, for a metal which forms the battery anode 15 of the batteries 10, an optimal metal material is selected and used depending on the type of the batteries 10 (manganese batteries/alkaline batteries/nickel hydride batteries).

Therefore, different Seebeck coefficients (αm, αa, and αn) are applied respectively when manganese batteries (10m), alkaline batteries (10a), and nickel hydride batteries (10n) are installed in the battery box 11. That is, the Seebeck voltage V differs depending on the types of the batteries 10 on condition that the temperature difference ΔT is uniform at the contact point m between the anode battery spring (metal A) 13 and the battery anode 15 (metal B).

Figure 4:
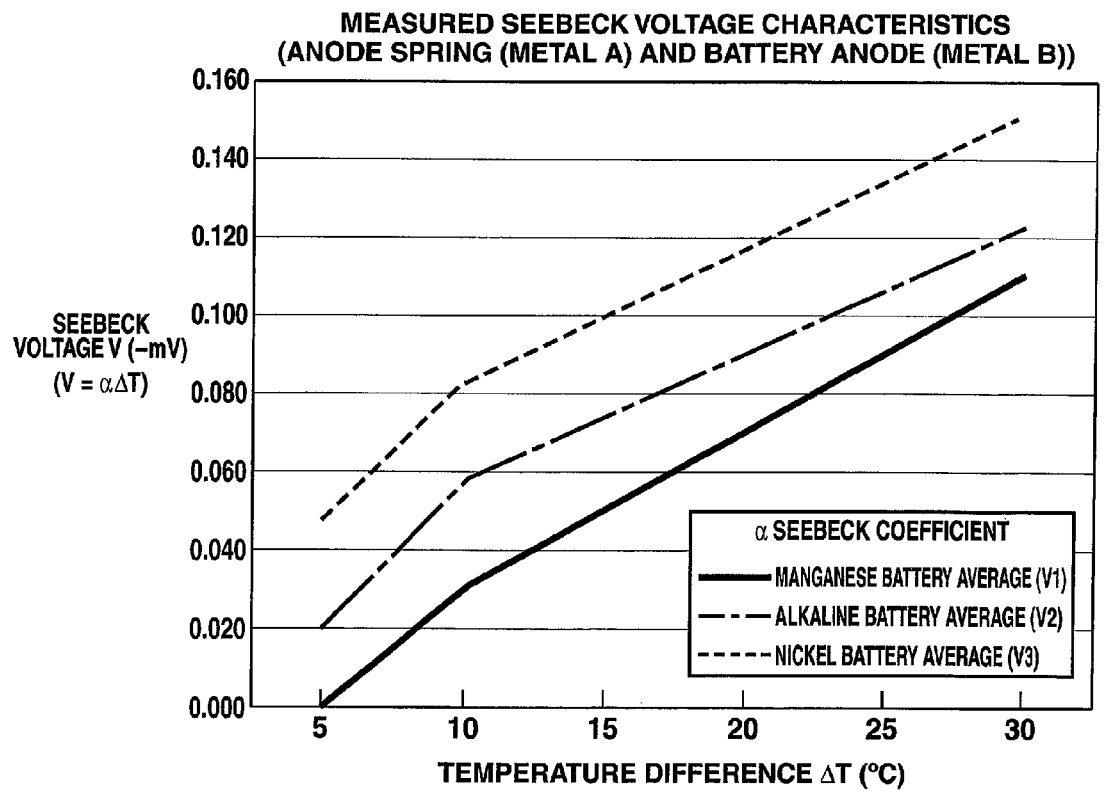
FIG. 4 is a measured characteristic graph showing averaged Seebeck voltages which are detected when various batteries are installed in the battery box 11 of the battery-type determination circuit.

FIG. 4 is a characteristic graph showing a result of measuring the Seebeck voltage when the temperature of a battery anode part is raised by 5 to 30° C. with the various types of batteries installed in the battery box 11 provided with the battery-type determination circuit described above which uses a steel wire SWPB for springs as a material of an anode battery spring. V1 expresses an averaged Seebeck voltage detected when manganese batteries are installed. V2 expresses an averaged Seebeck voltage detected when alkaline batteries are installed. V3 expresses an averaged Seebeck voltage detected when nickel hydride batteries are installed.

According to the measured Seebeck voltage characteristic graph, a temperature-difference ΔT at a contact point between the anode battery spring (metal A) 13 and the battery anode 15 (metal B) is specified at first. A Seebeck voltage V at this time is detected by the Seebeck voltage detector 18, and is compared with a threshold which has been preliminarily measured. In this manner, the type of batteries 10 installed in the battery box 11 can be determined.

That is, if the Seebeck voltage V is close to V1 when a contact temperature difference ΔT° C. is set, the batteries can be determined to be manganese batteries. If the Seebeck voltage is close to V2, the batteries can be determined to be alkaline batteries. If the Seebeck voltage is close to V3, the batteries can be determined to be nickel hydride batteries.

Figure 5:
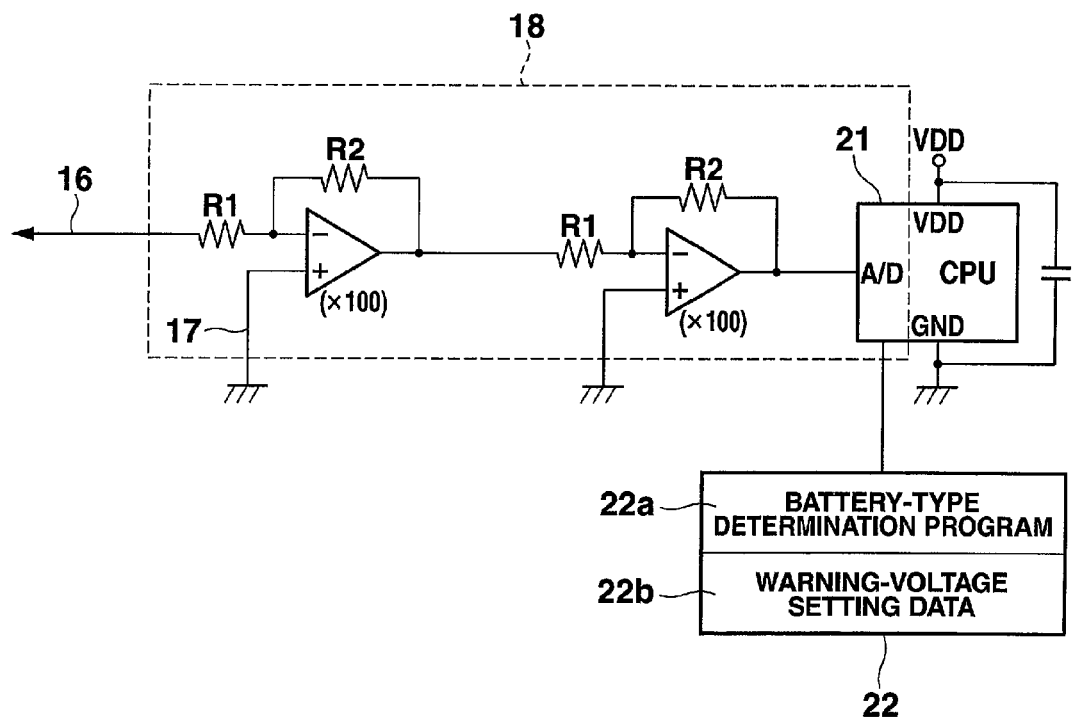
FIG. 5 is a circuit diagram showing a Seebeck voltage detector 18 in the battery-type determination circuit.

FIG. 5 is a circuit diagram showing the Seebeck voltage detector 18 in the battery-type determination circuit.

The Seebeck voltage V led from between the battery-spring-voltage detection terminal 16 and the battery-anode-voltage detection terminal 17 of the battery-type determination circuit is so low as, for example, 0.00 to 0.05 mV, as shown in the measured Seebeck voltage characteristic graph in FIG. 4 at a contact-temperature difference ΔT=5° C. Resolution is low when processing is performed after analog-to-digital conversion. Therefore, 100 times (×100) amplifiers are provided in two steps in the Seebeck voltage detector 18. The Seebeck voltage V led from between the battery-spring-voltage detection terminal 16 and the battery-anode-voltage detection terminal 17 is amplified to be 10000 times greater (×10000), and is supplied to an analog-to-digital converter of a CPU 21.

Accordingly, 0.1 V and 0.2 V are detected by the analog-to-digital converter of the CPU 21 when the Seebeck voltages V led from between the battery-spring-voltage detection terminal 16 and the battery-anode-voltage detection terminal 17 are 0.01 and 0.02 mV, respectively.

The CPU 21 is a controller which controls operation of the electronic apparatus, and is driven at a constant voltage VDD based on an output voltage of the two size-AA batteries 10 installed in the battery box 11.

A memory 22 is connected to the CPU 21, and electronic-apparatus control programs for controlling various operations of the electronic apparatus are stored in the memory 22. A battery-type determination program 22a for determining a type of batteries, based on a Seebeck voltage V subjected to the analog-to-digital conversion by the analog-to-digital converter, is stored as one of the electronic-apparatus control programs.

The memory 22 stores warning-voltage setting data 22b for setting a voltage (or threshold) for a battery consumption warning dependent on the type determined in accordance with the battery-type determination program 22a.

The electronic apparatus equipped with the battery-type determination circuit configured as described above achieves a battery-type determination function set forth in descriptions of operations below, as the CPU 21 controls operations of respective parts of the circuit in accordance with commands described in the electronic-apparatus control programs, to make software and hardware operate in corporation with each other.

Next, operation of the electronic apparatus equipped with the battery-type determination circuit configured as described above will be described.

In general, in an electronic apparatus which is driven by a battery power supply, the apparatus is operated and the battery power supply is applied with load. Then, the temperature of the batteries 10 rises accordingly. In the electronic apparatus according to the present embodiment, the temperature of the batteries 10 rises by 5° C. (=$\Delta$T) from the ambient temperature T through a predetermined operation for a constant time period.

FIG. 6 is a flowchart showing a battery-type determination processing in the electronic apparatus including the battery-type determination circuit.

When the power supply of the electronic apparatus is switched on, the battery-type determination program 22a stored in the memory 22 is started under control of the CPU 21. Firstly, a predetermined operation is continued for a constant time period, and the temperature of the batteries 10 installed in the battery box 11 rises by 5° C. (=$\Delta$T) from the ambient temperature T (Step S1).

Then, the Seebeck voltage V (×10000) led from between the battery-spring-voltage detection terminal 16 and the battery-anode-voltage detection terminal 17 is subjected to analog-to-digital conversion by the analog-to-digital converter of the CPU 21 and is read (Step S2). Next, a determination is made on whether or not the read voltage is smaller than or equal to 0.1 V (=0.01 mV×10000) as a determination threshold for manganese batteries which is preset based on the measured Seebeck voltage characteristic (refer to FIG. 4) (Step S3).

Here, if the Seebeck voltage V is determined to be greater than 0.1 V (step S3 [No]), a determination is made on whether or not the Seebeck voltage is smaller than or equal to 0.3 V (=0.03 mV×10000) as a determination threshold for alkaline batteries (Step S4).

If the Seebeck voltage V is determined to be smaller than 0.1 V in Step S3 (Step S3 [Yes]), the batteries 10 installed in the battery box 11 are determined to be manganese batteries, and a battery-consumption warning voltage 22b for manganese batteries is set in the memory 22 (Step S5).

Otherwise, if the Seebeck voltage V detected by the CPU 21 is determined to be greater than 0.1 V in the foregoing Step S3 (Step S3 [No]) and is determined to be smaller than or equal to 0.3 V (=0.03 mV×10000) in Step S4 (Step S4 [Yes]), the batteries 10 installed in the battery box 11 are determined to be alkaline batteries, and a battery-consumption warning voltage 22b for alkaline batteries is set in the memory 22 (Step S6).

Further, if the Seebeck voltage V is determined to be greater than 0.3 V in Step S4 (Step S4 [No]), the batteries 10 installed in the battery box 11 are determined to be nickel hydride batteries, and a battery-consumption warning voltage 22b for nickel hydride batteries is set in the memory 22 (Step S7).

In this manner, the type of the batteries 10 installed in the battery box 11 can be easily determined without influence from the remaining battery amount of the batteries 10. A proper battery-consumption warning voltage 22b can therefore be set in correspondence with the type of the batteries 10 being used.

After the batteries 10 being used are determined to be manganese batteries in Step S5, the CPU 21 further determines whether or not the detected Seebeck voltage V is maintained to be smaller than or equal to 1.1 V (=0.11 mV×10000) equivalent to the contact temperature difference $\Delta$T=30° C. (Step S8).

Here, if the Seebeck voltage V detected by the CPU 21 during use of the manganese batteries is determined to be greater than 1.1 V equivalent to the contact temperature difference $\Delta$T=30° C. (Step S8 [No]), abnormal heat generation of the batteries is determined to be caused by any problem occurring in the apparatus, and the system power supply is forcibly shut down (interrupted) (Step S9).

After the batteries 10 being used are determined to be manganese batteries also in Step S6, a further determination is made on whether or not the Seebeck voltage V is maintained to be smaller than or equal to 1.2 V (=0.12 mV×10000) equivalent to the contact temperature difference $\Delta$T=30° C. (Step S10).

Here, if the Seebeck voltage V detected by the CPU 21 during use of the alkaline batteries is determined to be greater than 1.2 V equivalent to the contact temperature difference $\Delta$T=30° C. (Step S10 [No]), abnormal heat generation of the batteries is determined to be caused by any problem occurring in the apparatus, and the system power supply is forcibly shut down (interrupted) (Step S9).

After the batteries 10 being used are determined to be nickel hydride batteries in Step S7, a further determination is made on whether or not the Seebeck voltage V is to be smaller than or equal to 1.5 V (=0.15 mV×10000) equivalent to the contact temperature difference $\Delta$T=30° C. (Step S11).

Here, if the Seebeck voltage V detected by the CPU 21 during use of the nickel hydride batteries is determined to be greater than 1.5 V equivalent to the contact temperature difference $\Delta$T=30° C. (step S11 [No]), abnormal heat generation of the batteries is determined to be caused by any problem occurring in the apparatus, as in the former cases, and the system power supply is forcibly shut down (interrupted) (Step S9).

In this manner, by monitoring the Seebeck voltage V from between the battery-spring-voltage detection terminal 16 and the battery-anode-voltage detection terminal 17 during use of the electronic apparatus, operational abnormality occurring inside the apparatus can be securely detected without being influenced by the remaining battery amount of the batteries 10 at all. The system power supply can then be shut down. Therefore, safety can be ensured when abnormal heat generation occurs in an apparatus using batteries.

In the embodiment described above, a voltage for monitoring abnormal heat generation is set after determining a battery type. As an alternative, A voltage as a threshold for warning a low voltage caused by consumption of batteries can be set depending on the type of batteries.

The foregoing embodiment is configured to determine the type of batteries 10 from the electromotive voltage V of the Seebeck effect V which is detected based on the difference of a metal material forming the battery anode (metal B) 15, to one of the batteries 10 which is in contact with the anode battery spring (metal A) 13 among a plurality of size AA batteries 10 installed in the battery box 11 in series.

Alternatively, the electromotive voltage V of the Seebeck effect may be configured to be detected for each of a plurality of batteries 10 installed in the battery box 11. A warning may be issued for mixture of different types of batteries.

The invention of the present application is not limited to the foregoing embodiment but can be variously modified in practical phases without deviating from the subject matters of the invention.

The embodiment further covers inventions in various stages, and various inventions can be derived by appropriate combinations of a plurality of disclosed components. For example, if several components are removed from all components disclosed in the embodiment or if several components are combined in a different form, a configuration obtained by removing or combining those components is derived as an invention insofar as problems are solved and effects are achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A battery-type determination apparatus comprising:
    a battery installation unit equipped with battery connection terminals in which a battery is installed;
    a voltage detector that detects a voltage generated by Seebeck effect between a battery connection terminal and an electrode of the battery;
    a temperature rise controller that raises a temperature at a contact point between the electrode of the battery and the battery connection terminal; and
    a type determination unit that determines a type of the battery installed in the battery installation unit, based on the voltage detected by the voltage detector with the temperature risen at the contact point.

2. The battery-type determination apparatus according to claim 1, further comprising a comparator that determines the type of the battery installed in the battery installation unit, by comparing the voltage generated by the Seebeck effect with thresholds which are set respectively for battery types.

3. The battery-type determination apparatus according to claim 2, wherein the temperature rise controller comprises an operation controller that raises a temperature of a body of the battery, by operating an apparatus on which the battery-type determination apparatus is installed.

4. The battery-type determination apparatus according to claim 3, wherein the temperature rise controller raises the temperature at the contact point until a predetermined temperature difference from the ambient temperature of the battery is generated.

5. The battery-type determination apparatus according to claim 4, wherein the contact point at which the voltage generated by the Seebeck effect is detected is a contact point between an anode of the battery and one of the battery connection terminals.

6. A battery-type determination method comprising:
    raising a temperature at a contact point between an electrode of a battery and a battery connection terminal of a battery installation unit;
    detecting a voltage generated by Seebeck effect between the battery connection terminal of the battery installation unit and the electrode of the battery, with a predetermined temperature rise caused at the contact point; and
    determining a type of the battery installed in the battery installation unit, based on the detected voltage.

7. The battery-type determination method according to claim 6, wherein the determining the type comprises determining the type of the battery installed in the battery installation unit, by comparing the voltage generated by the Seebeck effect with thresholds which are set respectively for battery types.

8. The battery-type determination method according to claim 7, wherein the raising the temperature at the contact point comprises raising the temperature until a predetermined temperature difference from an ambient temperature of the battery is generated.

9. The battery-type determination according to claim 8, wherein the contact point at which the voltage generated by the Seebeck effect is detected is a contact point between an anode of the battery and a battery connection terminal.

10. An electronic apparatus comprising:
    a battery installation unit equipped with battery connection terminals in which a battery is installed;
    a voltage detector that detects a voltage generated by Seebeck effect between a battery connection terminal and an electrode of the battery;
    a temperature rise controller that raises a temperature at a contact point between the electrode of the battery and the battery connection terminal; and
    a type determination unit that determines a type of the battery installed in the battery installation unit, based on the voltage detected by the voltage detector with the temperature risen at the contact point; and
    a voltage setting unit that sets a voltage value for monitoring a state of the battery, depending on the type of the battery determined by the type determination unit.

11. The electronic apparatus according to claim 10, wherein the voltage setting unit sets a voltage value for determining abnormal heat generation of the battery.

12. The electronic apparatus according to claim 11, further comprising:
    an abnormality determination unit that determines the abnormal heat generation of the battery by comparing the voltage detected by the voltage detector with the voltage value set by the voltage setting unit; and
    a power-supply-shutoff unit that shuts off a power supply voltage supplied from the battery installation unit when the battery is determined to be abnormally generating heat by the abnormality determination unit.

* * * * *